US011221356B2

(12) United States Patent
Putz

(10) Patent No.: US 11,221,356 B2
(45) Date of Patent: Jan. 11, 2022

(54) SINGLE-FAULT-TOLERANT ISOLATION RESISTANCE DETERMINATION IN A PHOTOVOLTAIC SYSTEM

(71) Applicant: SMA Solar Technology AG, Niestetal (DE)

(72) Inventor: Martin Putz, Kassel (DE)

(73) Assignee: SMA Solar Technology AG, Niestetal (DE)

(*) Notice: Subject to any disclaimer, the term of this patent is extended or adjusted under 35 U.S.C. 154(b) by 212 days.

(21) Appl. No.: 16/713,173

(22) Filed: Dec. 13, 2019

(65) Prior Publication Data

US 2020/0116770 A1    Apr. 16, 2020

Related U.S. Application Data

(63) Continuation of application No. PCT/EP2018/057513, filed on Mar. 23, 2018.

(30) Foreign Application Priority Data

Jun. 14, 2017 (DE) .................... 10 2017 113 192.2

(51) Int. Cl.
*G01R 27/18* (2006.01)
*G01R 27/02* (2006.01)
*H02S 50/10* (2014.01)

(52) U.S. Cl.
CPC ........... *G01R 27/18* (2013.01); *G01R 27/025* (2013.01); *H02S 50/10* (2014.12)

(58) Field of Classification Search
CPC ....... G01R 27/18; G01R 27/025; H02S 50/10; H02S 50/00; Y02E 10/50
See application file for complete search history.

(56) References Cited

U.S. PATENT DOCUMENTS 7,576,547 B2    8/2009 Mueller
8,537,510 B2    9/2013 Lehmann
(Continued)

FOREIGN PATENT DOCUMENTS

DE    102006037043 B3    2/2008
DE    102014206454 A1    10/2015
DE    102015102468 B3    6/2016

OTHER PUBLICATIONS

International Search Report dated Apr. 25, 2018 in connection with International Application No. PCT/EP2018/057513.

*Primary Examiner* — Alvaro E Fortich
*Assistant Examiner* — Zannatul Ferdous
(74) *Attorney, Agent, or Firm* — Eschweiler & Potashnik, LLC

(57) ABSTRACT

A method for a single-fault-tolerant determination of an isolation resistance of a photovoltaic system including an inverter and a solar generator connected thereto is disclosed. The isolation resistance is determined as a function of a test voltage drop in a resistor network, wherein the resistor network is connected to a variable voltage source by way of a first terminal, to a first pole of the solar generator by way of a second terminal and to a ground terminal of the inverter via an isolation relay by way of a third terminal. A capacitor is disposed between the ground terminal and the first pole of the solar generator. The method includes a) applying a first DC voltage value to the first terminal when the isolation relay is closed using the variable voltage source, b) applying a second DC voltage value to the first terminal when the isolation relay is closed using the variable voltage source, c) generating an AC voltage at the first terminal using the variable voltage source when the isolation relay is closed, d) generating the AC voltage at the first terminal using the variable voltage source when the isolation relay is open, and (Continued)

e) testing a function of the isolation relay by comparing an amplitude of the test voltage between the acts c) and d).

12 Claims, 4 Drawing Sheets

(56) References Cited

U.S. PATENT DOCUMENTS

| | | | |
|---|---|---|---|
| 9,467,070 B2* | 10/2016 | Hantschel | H02J 3/381 |
| 9,797,853 B2 | 10/2017 | Mueller | |
| 2005/0121067 A1 | 6/2005 | Toyomura | |
| 2012/0014020 A1 | 1/2012 | Lehmann | |
| 2015/0244315 A1* | 8/2015 | McNamara | H02J 7/35 |
| | | | 136/244 |
| 2018/0041072 A1* | 2/2018 | Clifton | H02J 15/00 |
| 2019/0181632 A1* | 6/2019 | Burra | F03D 17/00 |
| 2020/0274360 A1* | 8/2020 | Biris | F03D 9/255 |

* cited by examiner

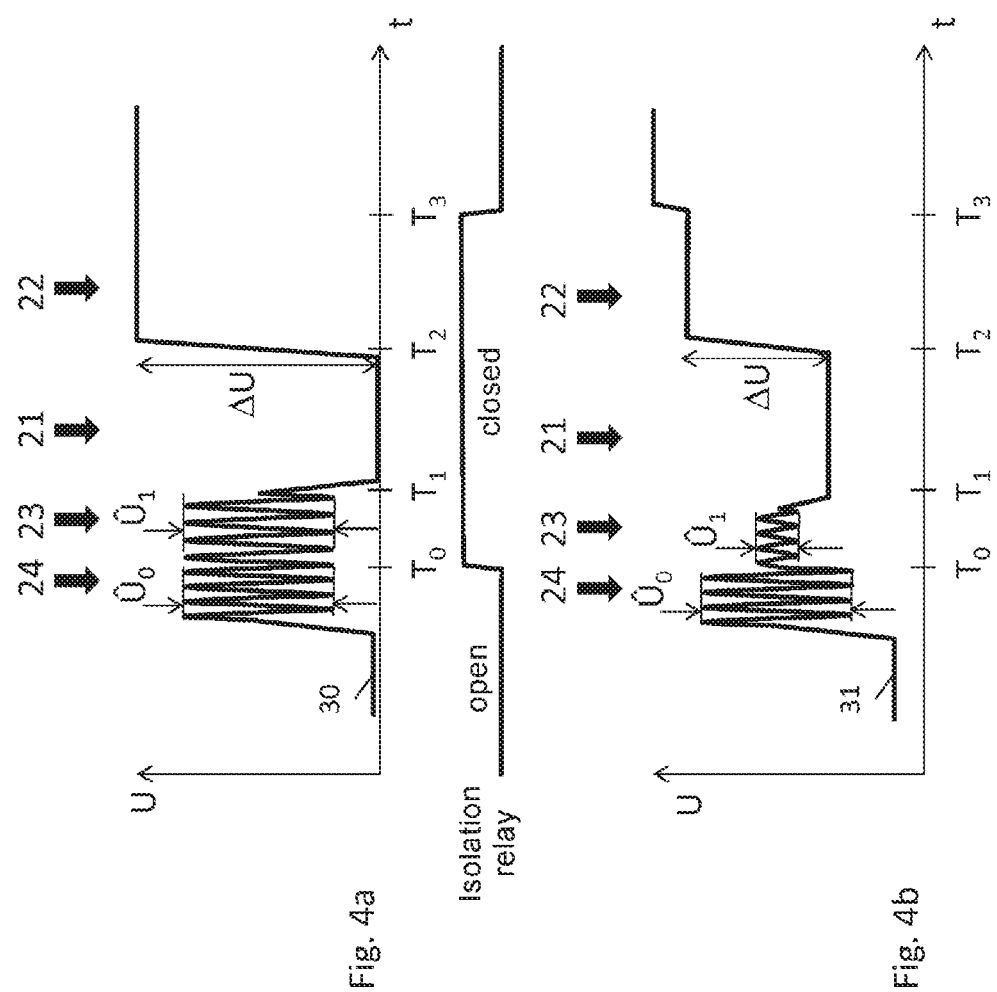

SINGLE-FAULT-TOLERANT ISOLATION RESISTANCE DETERMINATION IN A PHOTOVOLTAIC SYSTEM

CROSS REFERENCE TO RELATED APPLICATIONS

This application is a continuation of International Patent Application number PCT/EP2018/057513, filed on Mar. 23, 2018, which claims priority to German Patent Application number 10 2017 113 192.2, filed on Jun. 14, 2017, and is hereby incorporated by reference in its entirety.

FIELD

The disclosure relates to a method for a single-fault-tolerant determination of an isolation resistance of a photovoltaic system, and to an inverter configured to carry out the method.

BACKGROUND

Before a photovoltaic system is put into operation, it is necessary for safety reasons to determine whether the connected solar generator has a sufficiently high resistance in relation to the ground potential as a reference potential. As a rule, this test is at least carried out before the photovoltaic system is put into operation by connecting the inverter to a connected grid.

Documents EP 1 857 825 A1 and EP 2 230 522 A1 each describe methods in which, for the purposes of determining the isolation resistance, a current path to a ground terminal is alternately established by one pole of a direct current source in each case and the current flows arising in each case are compared to one another.

Furthermore, document DE 10 2012 104 752 B3 describes that the alternating current path is provided by the bridge switches of an inverter half-bridge and that the current flow to be compared can be driven by an AC voltage at a frequency preferably lying below the grid frequency. Here, the current path is established by closing a ground switch during the determination of the isolation resistance.

Should the ground switch fail in this method, in particular should the ground switch not close correctly, a measurement result is obtained, which resembles a high isolation resistance, possibly an indeterminably high isolation resistance, and which consequently suggests a safe isolation state independently of the real isolation state present. In order to protect against this case, the ground terminal can be connected via a suitably dimensioned comparison resistor to a pole of the direct current source such that a faulty ground switch can be inferred should an isolation resistance be determined that is higher than the resistance value of the comparison resistor. However, a disadvantage of this procedure is that this permanently reduces the intrinsic isolation properties of the inverter.

Alternatively, in the case of an emergency generator system in which a neutral conductor should be connected to a ground conductor during emergency operation, DE 10 2015 102 468 B3 proposes connecting a conductor, to which a voltage has been applied, to the ground conductor via a current-reducing element for the purposes of testing this connection in order thus to produce a measuring current over the connection to be tested. The disadvantages as a result of the test current described above are also present here.

SUMMARY

The present disclosure is directed to a method for determining an isolation resistance of a photovoltaic system, in which a faulty ground switch can be identified without the isolation properties of an inverter of the photovoltaic system being impaired.

A method according to the disclosure for a single-fault-tolerant determination of an isolation resistance can be carried out within a photovoltaic system comprising an inverter and a solar generator connected thereto, wherein the isolation resistance is determined as a function of a test voltage drop in a resistor network, wherein the resistor network is connected to a variable voltage source by way of a first terminal, to a first pole of the solar generator by way of a second terminal, and to a ground terminal of the inverter via an isolation relay by way of a third terminal. A capacitor is disposed between the ground terminal and the first pole of the solar generator. The method according to the disclosure comprises the following acts in arbitrary order:

applying by way of the variable voltage source a first DC voltage value to the first terminal when the isolation relay is closed (act A), applying by way of the variable voltage source a second DC voltage value to the first terminal when the isolation relay is closed (act B), generating an AC voltage at the first terminal with the aid of the variable voltage source when the isolation relay is open (act C), and generating the AC voltage at the first terminal with the aid of the variable voltage source when the isolation relay is closed (act D).

The function of the isolation relay is tested by comparing an amplitude of the test voltage between the two acts in which the AC voltage is generated. The amplitude of the test voltage changes by switching the isolation relay since the capacitor forms a defined impedance, over which an AC current can flow in the case of a closed isolation relay. However, the DC isolation properties of the inverter are not altered in disadvantageous fashion by this capacitor, which also improves the EMC behavior of the inverter.

Advantageously, the isolation resistance can be determined as a function of the difference in the test voltage between the acts in which the first and second DC voltage value, respectively, are applied to the first terminal.

In one embodiment the inverter is separated from the grid when the method according to the disclosure is carried out. By way of example, the isolation resistance is determined in the morning, before a connection to the grid. The connection is only carried out in the case of an admissibly high isolation resistance and in the case of a functional isolation relay.

In one embodiment the variable voltage source is formed by an inverter bridge of the inverter, said inverter bridge being disposed between the first pole and a second pole and the mid point of said inverter bridge being connected to the first terminal of the resistor network, for example, via a grid filter. Here, the first and second DC voltage values can simply be applied by virtue of the first terminal being connected to the first and second pole, respectively, by sustained closure of respectively one of the switches of the inverter bridge.

In one embodiment of the method according to the disclosure, the AC voltage is generated with the grid frequency at the first terminal. However, it is also conceivable for a different frequency to be used, in particular a higher frequency than the grid frequency. This amplifies the influence on the damping of the voltage amplitude by the capacitor when the isolation relay is closed in comparison with the voltage amplitude when the isolation relay is opened.

In one embodiment, the first terminal is connected to the mid point of the inverter bridge by way of a grid filter. This effectively eliminates from the determined test voltage radio frequency AC voltage signals generated by means of the half-bridge when generating the AC voltage.

In order to minimize the number of switching processes of the isolation relay, it is advantageous to successively carry out the acts carried out when the isolation relay is closed. Furthermore, it is advantageous to carry out in succession the two acts in which an AC voltage is produced by the half-bridge. A particularly suitable sequence for carrying out the acts is to initially carry out act C, then act D, then act A and subsequently act B. However, it is likewise conceivable to initially carry out acts A and B, followed by act D and, finally, act C. However, this should not preclude other sequences.

In one embodiment, the method is carried out again if the test of the function of the isolation relay or the determination of the isolation resistance has led to inadmissible results. By way of example, this is the case if the amplitude determined in act D is greater than the amplitude determined in act C. However, instead of repeating the entire method, it is also possible that only individual method acts, for example acts C and D, are repeated. The method (or only acts A and B) can also be carried out again in order to verify the result in the case of a certain isolation resistance which does not admit an intended operation of the photovoltaic system. A first fault signal can be generated in the case of a negative function test of the isolation relay; a second fault signal can be generated in the case of an isolation resistance determined as too low for an admissible operation of the photovoltaic system. The first and/or second fault signal can be transferred within the photovoltaic system or to a receiver outside of the photovoltaic system.

In one embodiment, the test voltage can be determined as a voltage drop across a resistor connected to the first pole of the solar generator. This is advantageous, in particular, if parts of the measuring electronics of the inverter use the potential of the first pole as a reference potential. Further, the resistor network may have a limiting resistor which is disposed between the first terminal and the third terminal and, in particular, limits the current flowing in the case of an extremely low isolation resistance when the isolation relay is closed.

An inverter according to the disclosure is configured to carry out the method and controls the method steps by means of its control electronics.

BRIEF DESCRIPTION OF THE FIGURES

Below, the disclosure will be explained in more detail with the aid of figures, in which FIG. 4a shows an example time curve of a test voltage in the case of a defective isolation relay, and FIG. 4b shows an example time curve of a test voltage in the case of an intact isolation relay.

DETAILED DESCRIPTION

Figure 1:
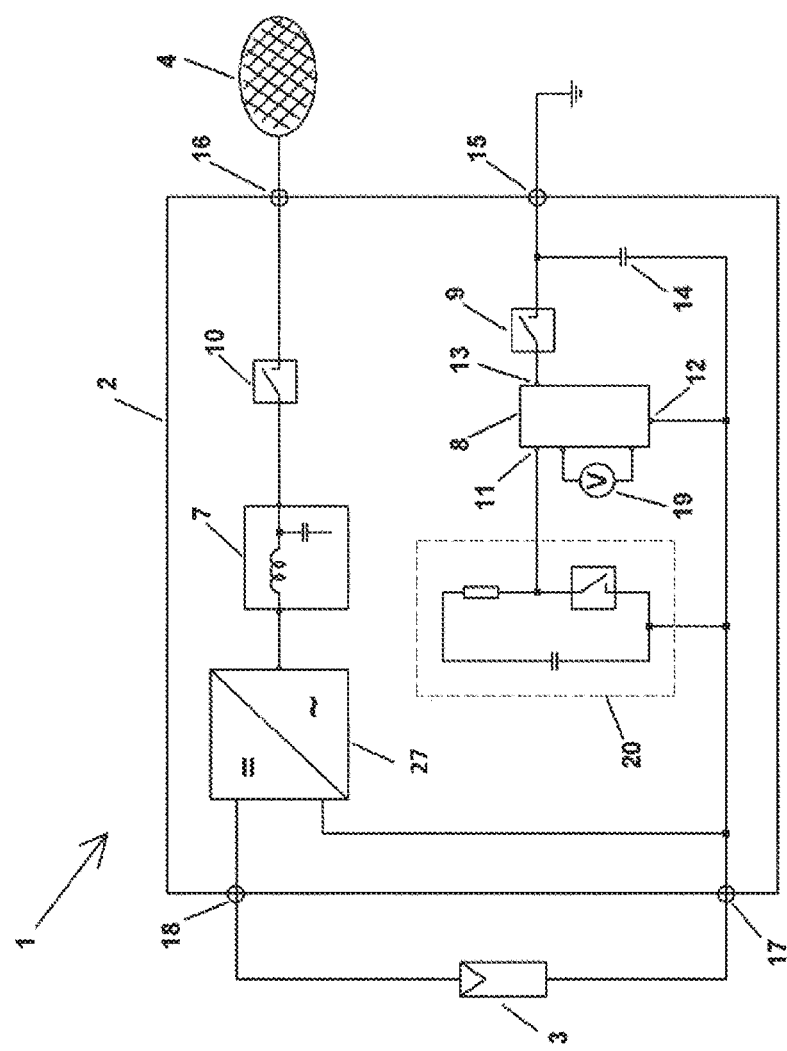
FIG. 1 shows an inverter for carrying out the method according to the disclosure.

FIG. 1 shows an inverter 2 that is configured to carry out the method according to the disclosure. A solar generator 3 is connected to a first pole 17 and a second pole 18 of the inverter 2. A DC/AC converter 21 is connected on the input side with both poles 17, 18 and serves to convert the DC power of the solar generator 3 into AC power, which is provided on the output side via a grid filter 7 and a grid relay 10 at a grid terminal 16 for a feed into a connected grid 4. For the purposes of a single-fault-tolerant determination of an isolation resistance of the solar generator 3, provision is made of a variable voltage source 20 that is connected to a first terminal 11 of a resistor network 8, wherein the resistor network 8 furthermore has a second terminal 12, which is connected to the first pole 17, and a third terminal 13, which is connected to a ground terminal 15 via an isolation relay 9. A test voltage drop in the resistor network 8 is determined by means of a measuring device 19. Furthermore, a capacitor 14 connects the ground terminal 15 to the first pole 17. The capacitor 14 is often also referred to as a Y capacitor and serves, inter alia, to improve the EMC behavior of the inverter 2.

The variable voltage source 20 can be formed by a DC voltage source, for example, a capacitor, that provides a voltage at the first terminal 11 via the mid point of a series circuit of a resistor and a switch, which voltage can be variably set by way of the switching state of the switch. By way of example, the capacitor can be charged to a predetermined voltage by an on-board power supply of the inverter 2. The required power can be taken both from the solar generator 3 and from the grid 4. The variable voltage source 20 has a fixed potential reference to a potential of the solar generator and it is connected, for example, directly to the first pole 17 with one pole, as indicated by way of a dashed line in FIG. 1.

By way of a suitable actuation of the isolation relay 9 and the variable voltage source 20, it is possible to generate the different voltage curves at the first terminal 11 in the case of an appropriate switching state of the isolation relay 9 according to the steps of the method according to the disclosure and it is possible to ascertain the test voltages or the amplitudes thereof in the individual acts. The acts of the method are, in one embodiment, carried out before the inverter 2 is connected to the grid 4 and the grid relay 10 is only closed once the determination of the isolation resistance has yielded both a functional isolation relay 9 and a sufficiently high isolation resistance of the connected solar generator 3.

Figure 2:
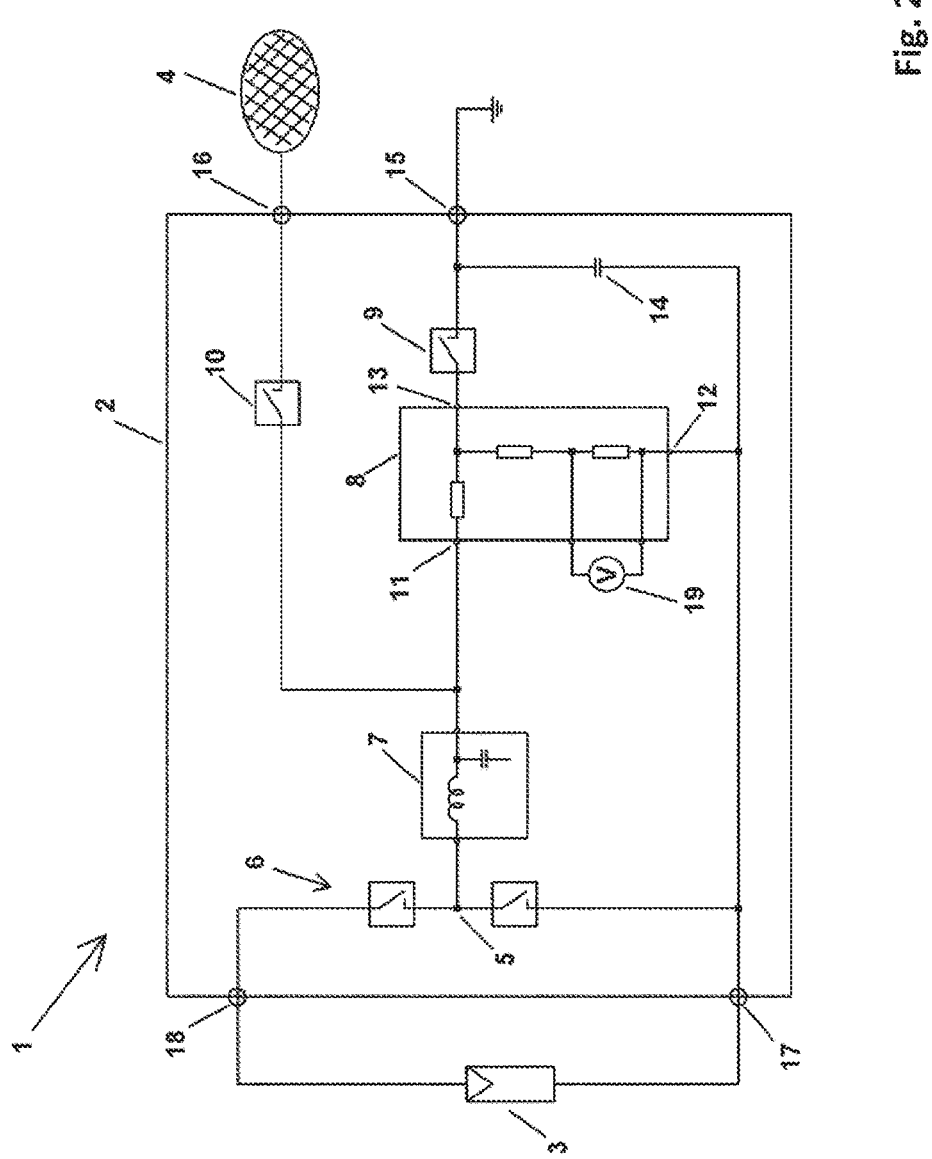
FIG. 2 shows an embodiment of an inverter for carrying out the method according to the disclosure.

FIG. 2 shows an embodiment of the inverter 2, in which the variable voltage source is formed by an inverter bridge 6, which is disposed between the first pole 17 and the second pole 18 and the mid point 5 of which is connected as a bridge output to the first terminal 11 of the resistor network 8 via the grid filter 7. Applying the DC voltages to and generating the AC voltages at the first terminal 11 within the scope of the method according to the disclosure is implemented by a suitable actuation of the switches of the inverter bridge 6. In particular, a first DC voltage value can be applied to the first terminal 11 by sustained closure of the one half-bridge switch, as a result of which the first pole 17 is connected to the first terminal 11. Accordingly, a second DC voltage value can be applied to the first terminal 11 by sustained closure of the other half-bridge switch, as a result of which the second pole 18 is connected to the first terminal 11. The AC voltage can be produced at the first terminal 11 by alternating clocked actuation of both half-bridge switches.

In the present case, the resistor network 8 comprises a resistive voltage divider, which comprises three resistors connected in series between the first terminal 11 and the second terminal 12. The mid point between the resistor connected to the first terminal 11 and the central resistor is connected to the third terminal 13. The measuring device 19 determines a test voltage, which drops across the resistor of the voltage divider connected to the second terminal 12.

Figure 3:
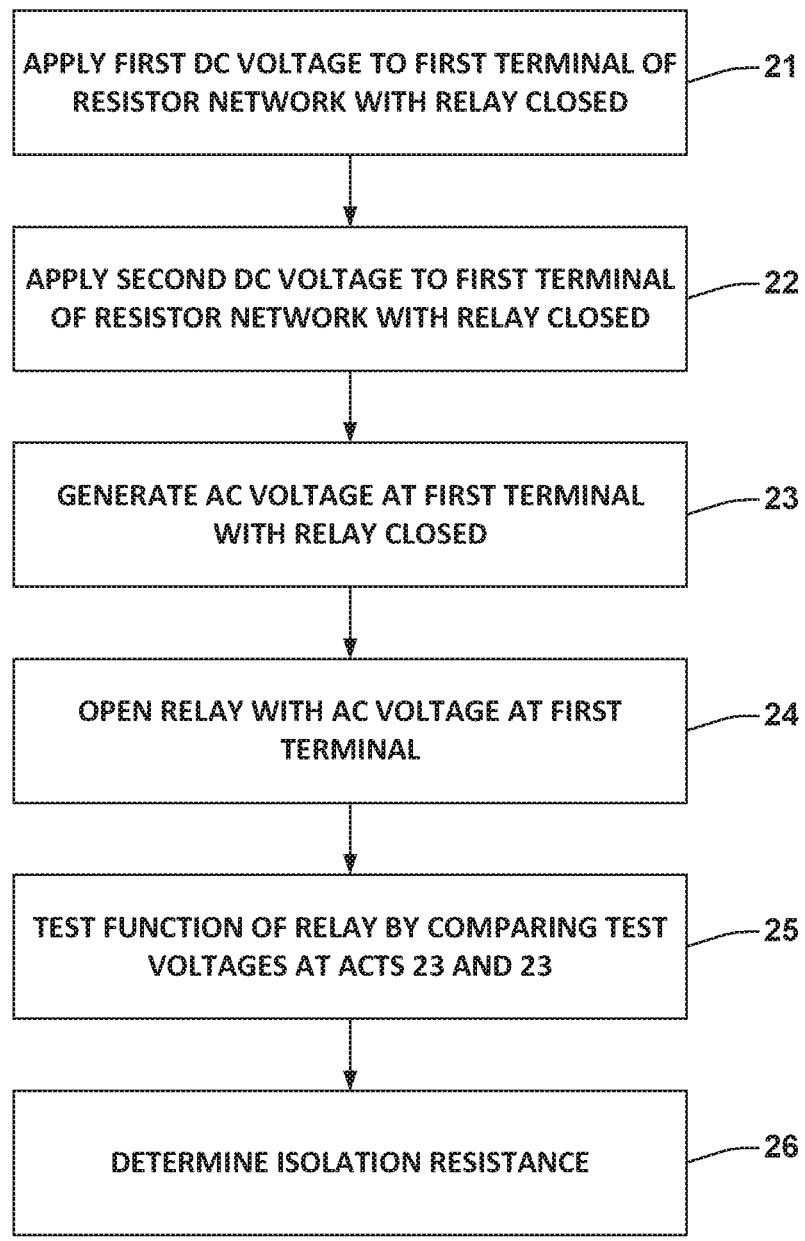
FIG. 3 shows a flowchart of the method according to the disclosure.

FIG. 3 shows a procedure of the method according to the disclosure, which is carried out using the inverter described in FIG. 1 or in FIG. 2, for example. In a first act 21, a first DC voltage value is applied by a variable DC voltage source to a first terminal of a resistor network when an isolation relay is closed. By way of example, a first pole of a solar generator is connected to a first terminal of a resistor network. This connection can be implemented by closing a first switch of a half-bridge of the inverter, which is connected to the first pole of the solar generator.

In a second act 22, a second DC voltage value is applied by the variable DC voltage source to the first terminal of the resistor network, with the isolation relay likewise being closed. By way of example, the second pole of the solar generator is connected to the first terminal. This connection can be implemented by closing a second switch of the half-bridge of the inverter, which is connected to the second pole of the solar generator.

In a third act 23, an AC voltage is generated at the first terminal by the variable DC voltage source, in particular by way of an inverter bridge disposed between the first and the second pole, while the isolation relay is closed. The isolation relay is opened in a fourth act 24, while the AC voltage continues to be generated by the variable DC voltage source at the first terminal.

In the method, acts 21 to 24 can be carried out in arbitrary sequence. Respectively one test voltage is ascertained in each act, the test voltage dropping across a resistor of the resistor network. A function test of the isolation relay is carried out in a fifth act 25 by comparing the amplitude of the test voltage between the third act 23 and the fourth act 24. Furthermore, the isolation resistance is determined in a sixth act 26 from the test voltages ascertained within the scope of acts 21 to 24. In one embodiment, the isolation resistance is determined from a difference between the test voltages ascertained in the first act 21 and in the second act 22. However, it is also conceivable for the amplitude of the test voltage in the third act 23 and/or fourth act 24 to be taken into account when determining the isolation resistance. It is likewise conceivable to carry out the sixth act 26 before the fifth act 25, or to only carry out said sixth act under the condition of the fifth act 25 having led to the result of functional isolation relay.

A possible curve 30 of the test voltage while the method according to the disclosure is carried out is shown in the case of a faulty isolation relay in FIG. 4a, while FIG. 4b shows the curve 31 of the test voltage in the case of an intact isolation relay.

In the curves shown, the fourth act 24 is initially carried out up to a time T0, as a result of which an AC voltage with an amplitude $\hat{U}0$ arises as test voltage. Subsequently, the third act 23 is carried out up to a time T1 by virtue of the isolation relay being closed while the AC voltage is generated by way of the inverter half-bridge. An AC voltage with an amplitude $\hat{U}1$ arises as the test voltage during the third act 23. In the scenario underlying FIG. 4a, the isolation relay is defective such that it does not close on account of corroded relay contacts, for example, or such that it is closed during both acts 23, 24, for example on account of welded relay contacts. What arises herefrom is that the amplitude $\hat{U}0$ does not differ, or does not differ substantially, from the amplitude $\hat{U}1$.

Subsequently, the first act 21 is carried out up to a time T2 and then the second act 22 is carried out up to a time T3. The isolation relay is opened again at the time T3. A value for the isolation resistance can be ascertained from the arising difference ΔU between the test voltages ascertained in the first act 21 and in the second act 22. If the isolation relay is defective, the value determined thus is not reliable, however, for example because an isolation resistance value that is admissibly high for the operation is determined independently of the real isolation resistance of the solar generator present should the isolation relay not be able to close. In this case, an inadmissible operation of the photovoltaic system may arise if the outage of the isolation relay is not identified.

If the isolation relay is intact, then, in accordance with the curve 31 of the test voltage according to FIG. 4b, an AC voltage with an amplitude $\hat{U}0$ likewise arises as test voltage during the fourth act 24 and an AC voltage with the amplitude $\hat{U}1$ likewise arises during the third act 23. Since closing the isolation relay offers the applied AC voltage an additional current path, at least via the capacitor between the ground terminal and the first pole of the solar generator, independently of a possible isolation resistance of the solar generator, the amplitude $\hat{U}1$ during the third act 23 is less than the amplitude $\hat{U}0$ during the fourth act 24. This difference in amplitude is used to diagnose a functional isolation relay. By way of example, a threshold that distinguishes the case of a functional isolation relay from the case of a non-functional isolation relay as a difference or ratio between the amplitudes may be predetermined.

Recharging processes also arise on account of the capacitor between the ground terminal and the first pole of the solar generator, particularly during the first act 21 and the second act 22. Therefore, it is advantageous to design the duration of the first act 21 and of the second act 22 such that a sufficient time remains in order to be able to await the respective recharging process before measuring the test voltage for the purposes of determining the isolation resistance measurement. The duration of the recharging process can be suitably chosen by choosing the capacitance value of the capacitor and the resistance values in the resistor network. Naturally, it is also possible to capture the curve of the voltage during the recharging process and take this into account when determining the test voltage. Evaluating the voltage curve during the recharging process, which typically has an exponential curve with a decay time, in particular renders it possible to quantitatively capture an additional capacitance component caused by a stray capacitance of the solar generator if the capacitance value of the capacitor is known, and subsequently take account of said additional capacitance component during the operation of the photovoltaic system. This capture can also be implemented by evaluating the amplitudes of the test voltage during steps 23 and 24 with an open or closed isolation relay.

The invention claimed is:

1. A method for a single-fault-tolerant determination of an isolation resistance of a photovoltaic system comprising an inverter and a solar generator connected thereto, wherein the isolation resistance is determined as a function of a test voltage drop in a resistor network, wherein the resistor network is connected to a variable voltage source by way of a first terminal, to a first pole of the solar generator by way of a second terminal and to a ground terminal of the inverter via an isolation relay by way of a third terminal, wherein a capacitor is disposed between the ground terminal and the first pole of the solar generator, the method comprising:

a) applying a first Direct Current (DC) voltage value to the first terminal when the isolation relay is closed using the variable voltage source;
b) applying a second DC voltage value to the first terminal when the isolation relay is closed using the variable voltage source;
c) generating an Alternating Current (AC) voltage at the first terminal using the variable voltage source when the isolation relay is closed;
d) generating the AC voltage at the first terminal using the variable voltage source when the isolation relay is open; and
e) testing a function of the isolation relay by comparing an amplitude of the test voltage between the acts c) and d).

2. The method as claimed in claim 1, further comprising determining the isolation resistance as a function of a difference in a determined test voltage between acts a) and b).

3. The method as claimed in claim 1, wherein the acts are carried out while the inverter is separated from a grid.

4. The method as claimed in claim 1, wherein the variable voltage source comprises an inverter bridge of the inverter, wherein the inverter bridge is disposed between a first pole and a second pole of the solar generator, and a mid point of the inverter bridge is connected to the first terminal via a grid filter.

5. The method as claimed in claim 4, wherein the first DC voltage value is applied to the first terminal of the resistor network by a connection with the first pole and the second DC voltage value is applied to the first terminal of the resistor network by a connection with the second pole.

6. The method as claimed in claim 1, wherein the AC voltage is generated with a grid frequency at the first terminal.

7. The method as claimed in claim 1, wherein the method is carried out in the following sequence: act d), followed by act c), followed by act a), followed by act b).

8. The method as claimed in claim 1, wherein the method is carried out again if the test of the function of the isolation relay leads to inadmissible results.

9. The method as claimed in claim 1, further comprising generating a fault signal in the case of a negative function test or in the case of an isolation resistance that has been determined as inadmissibly below a threshold.

10. The method as claimed in claim 1, wherein the test voltage is determined as a voltage drop across a resistor connected to the first pole of the solar generator.

11. The method as claimed in claim 1, wherein the first terminal is connected to the third terminal via a limiting resistor.

12. An inverter for a single-fault-tolerant determination of an isolation resistance of a photovoltaic system comprising a solar generator connected to the inverter, the inverter being configured to determine the isolation resistance as a function of a test voltage drop in a resistor network of the inverter, wherein the resistor network is connected to a variable voltage source of the inverter by way of a first terminal, to a first pole of the solar generator by way of a second terminal and to a ground terminal of the inverter via an isolation relay by way of a third terminal, wherein a capacitor is disposed between the ground terminal and the second terminal, the inverter being configured to:
a) apply a first Direct Current (DC) voltage value to the first terminal when the isolation relay is closed using the variable voltage source;
b) apply a second DC voltage value to the first terminal when the isolation relay is closed using the variable voltage source;
c) generate an Alternating Current (AC) voltage at the first terminal using the variable voltage source when the isolation relay is closed;
d) generate the AC voltage at the first terminal using the variable voltage source when the isolation relay is open; and
e) test a function of the isolation relay by comparing an amplitude of the test voltage between the acts c) and d).

* * * * *